US012751298B2

(12) United States Patent
Katamawari et al.

(10) Patent No.: US 12,751,298 B2
(45) Date of Patent: Sep. 29, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Riku Katamawari, Nonoichi Ishikawa (JP); Hideharu Kojima, Kanazawa Ishikawa (JP); Takeyuki Suzuki, Kaga Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 348 days.

(21) Appl. No.: 18/458,899

(22) Filed: Aug. 30, 2023

(65) Prior Publication Data

US 2024/0321696 A1 Sep. 26, 2024

(30) Foreign Application Priority Data

Mar. 24, 2023 (JP) ................................ 2023-048153

(51) Int. Cl.
*H10W 70/40* (2026.01)
*H10W 90/00* (2026.01)

(52) U.S. Cl.
CPC ........ *H10W 70/481* (2026.01); *H10W 90/736* (2026.01)

(58) Field of Classification Search
CPC ... H01L 24/83; H01L 24/32; H01L 23/49562; H01L 24/29; H01L 23/49513;
(Continued)

(56) References Cited

U.S. PATENT DOCUMENTS 5,793,063 A * 8/1998 Whitney ............... H10F 30/263 257/107
2007/0200223 A1* 8/2007 Konishi .................. H01L 24/27 257/E29.022
(Continued)

FOREIGN PATENT DOCUMENTS

JP S61096542 U 6/1986
JP S63120431 A 5/1988
(Continued)

OTHER PUBLICATIONS

Notice of Reasons for Refusal (Office Action) dated Feb. 20, 2026 mailed in counterpart Japanese Patent Application No. 2023-048153, with English machine translation, 11 pages.
(Continued)

*Primary Examiner* — Mouloucoulaye Inoussa
(74) *Attorney, Agent, or Firm* — Kim & Stewart LLP

(57) ABSTRACT

A semiconductor device according to the present embodiment includes a lead frame and a semiconductor chip. The lead frame includes a frame main surface and a frame convex portion provided on the frame main surface. The semiconductor chip includes a semiconductor layer and an electrode provided on a bottom surface of the semiconductor layer and bonded to the frame convex portion. The electrode of the semiconductor chip has a protrusion surrounding the frame convex portion, and an outer side surface of the protrusion is flush with a side surface of the semiconductor layer.

20 Claims, 15 Drawing Sheets

(58) Field of Classification Search
CPC ............ H01L 23/49503; H01L 23/367; H01L 21/4871; H01L 23/3672; H01L 23/49811; H01L 23/3675; H01L 2224/32245; H01L 2924/13091; H01L 2924/13055; H01L 2224/3207; H01L 2224/32058; H01L 2224/83447; H01L 2224/83411; H01L 2224/83862; H01L 2224/26175; H01L 2224/8335; H01L 2224/29191; H01L 2224/83444; H01L 2924/1515; H01L 2224/2919; H01L 2224/83455; H01L 2224/83464; H01L 2224/83469; H01L 2224/83192; H01L 2224/83439; H01L 2023/4043; H05K 7/209
See application file for complete search history.

(56) References Cited

U.S. PATENT DOCUMENTS

2009/0079051 A1* 3/2009 Amano ............ H01L 23/49548 257/676
2011/0230046 A1* 9/2011 Gruenhagen ..... H01L 23/49524 438/652
2019/0378810 A1* 12/2019 Yoshioka ............ H01L 23/4952
2021/0005529 A1* 1/2021 Pfefferlein ............ H01L 23/367
2022/0238651 A1* 7/2022 Nakashiba .............. H01L 24/08
2024/0421049 A1* 12/2024 Okamoto ................ H01L 24/73

FOREIGN PATENT DOCUMENTS

JP H05-308084 A 11/1993
JP 2002368018 A 12/2002
JP 2007-227762 A 9/2007
JP 4174978 B2 11/2008
JP 2014099584 A 5/2014
JP 2022112707 A 8/2022
JP 2023077674 A 6/2023

OTHER PUBLICATIONS

Notice of Reasons for Refusal (Office Action) dated Jun. 16, 2026, mailed in corresponding Japanese Patent Application No. 2023-048153, with English machine translation, 8 pages.

* cited by examiner

SEMICONDUCTOR DEVICE

CROSS-REFERENCE TO RELATED APPLICATIONS

This application is based upon and claims the benefit of priority from the prior Japanese Patent Application No. 2023-048153, filed on Mar. 24, 2023; the entire contents of which are incorporated herein by reference.

FIELD

Embodiments described herein relate generally to a semiconductor device.

BACKGROUND

Examples of a semiconductor device manufactured by using a lead frame include a metal oxide semiconductor field effect transistor (MOSFET), an insulated gate bipolar transistor (IGBT), and a fast recovery diode (FRD). Processes of manufacturing these semiconductor devices include a process of mounting a semiconductor chip on the lead frame.

In this mounting process, there is a problem that a position and an angle of the semiconductor chip are deviated. Conventionally, this problem has been coped with by suppressing deviation or allowing deviation. However, in the case of suppressing the deviation, there are problems such as an increase in process difficulty due to an addition of a position adjustment process and an increase in cost due to the necessity of a separate jig. On the other hand, when the deviation is allowed, an area occupancy of the semiconductor chip with respect to the lead frame decreases, and downsizing of the semiconductor device is hindered.

DETAILED DESCRIPTION

Figure 1A:
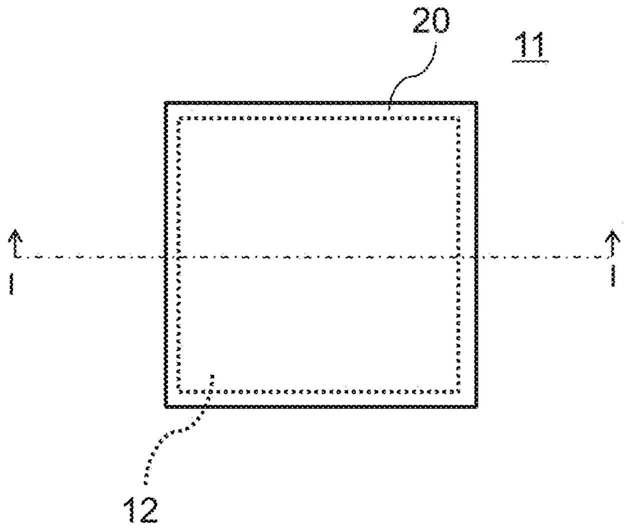
FIG. 1A is a plan view of a semiconductor device according to a first embodiment.

A semiconductor device according to an embodiment includes a lead frame and a semiconductor chip. The lead frame includes a frame main surface and a frame convex portion provided on the frame main surface. The semiconductor chip includes a semiconductor layer and an electrode provided on a bottom surface of the semiconductor layer and bonded to the frame convex portion. The electrode of the semiconductor chip has a protrusion surrounding the frame convex portion, and an outer side surface of the protrusion is flush with a side surface of the semiconductor layer.

Hereinafter, an embodiment according to the present invention will be described with reference to the drawings. The embodiments do not limit the present invention. The drawings are schematic or conceptual, and a ratio of each portion and the like are not necessarily the same as actual ones. In the specification and the drawings, the same elements as those described above with respect to the previously described drawings are denoted by the same reference numerals, and the detailed description thereof is appropriately omitted.

In addition, for example, terms such as "parallel" and "the same" that specify shapes and geometric conditions and degrees thereof, which are used in the present specification, are interpreted including a range in which similar functions can be expected without being bound by a strict meaning.

First Embodiment

Figure 1B:
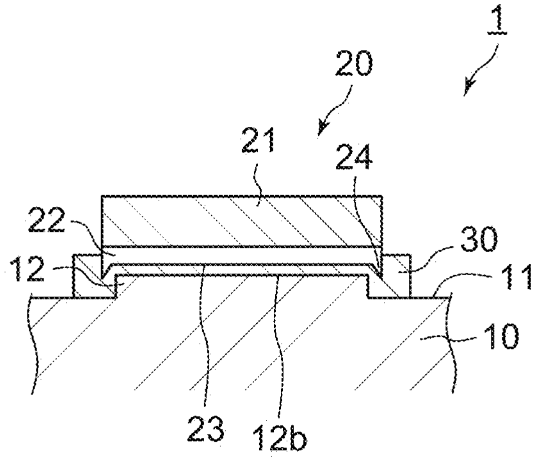
FIG. 1B is a cross-sectional view of the semiconductor device according to the first embodiment taken along line I-I in FIG. 1A.
Figure 2:
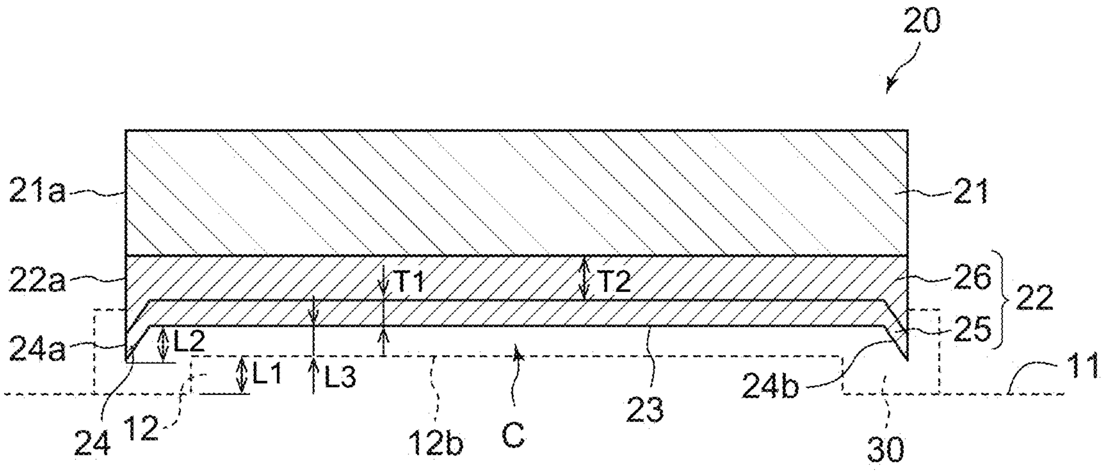
FIG. 2 is a cross-sectional view of the semiconductor chip according to an embodiment.
Figure 3A:
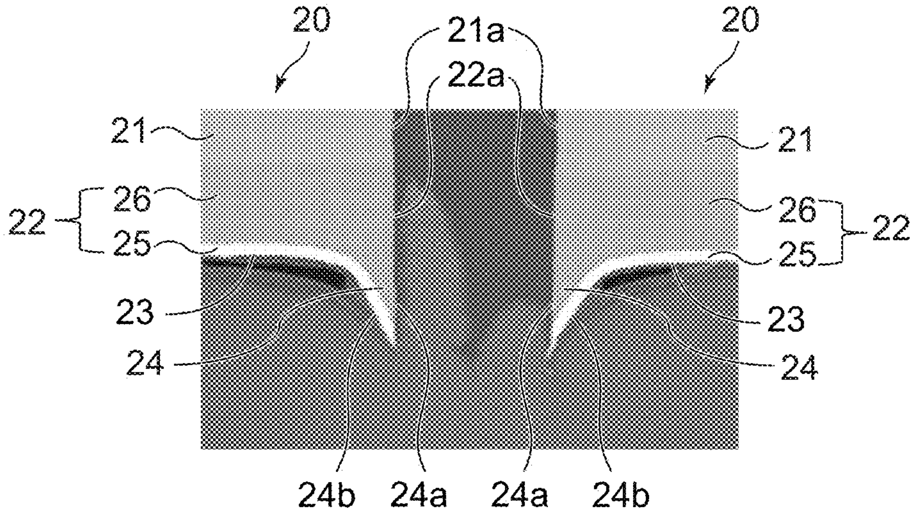
FIG. 3A is an SEM image of a semiconductor chip in a dicing portion after dicing a semiconductor wafer according to the embodiment.
Figure 3B:
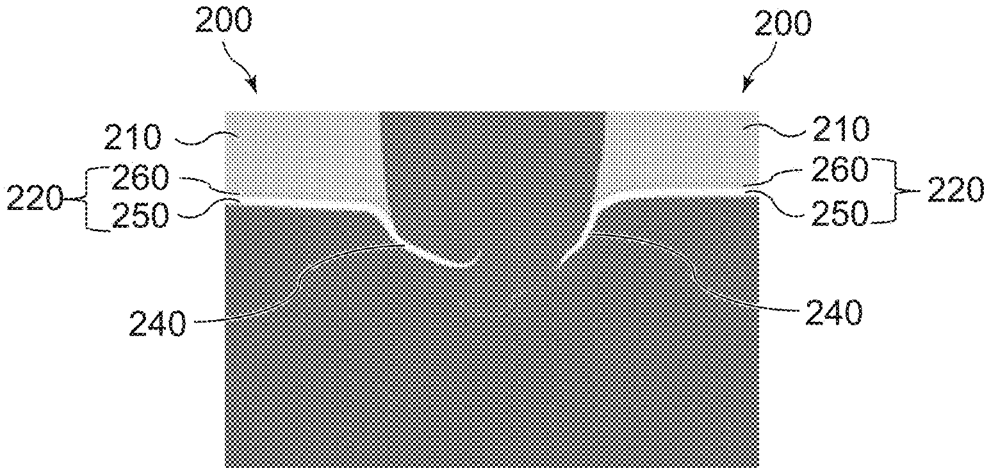
FIG. 3B is an SEM image of the semiconductor chip in the dicing portion after dicing a semiconductor wafer according to a comparative example.
Figure 4:
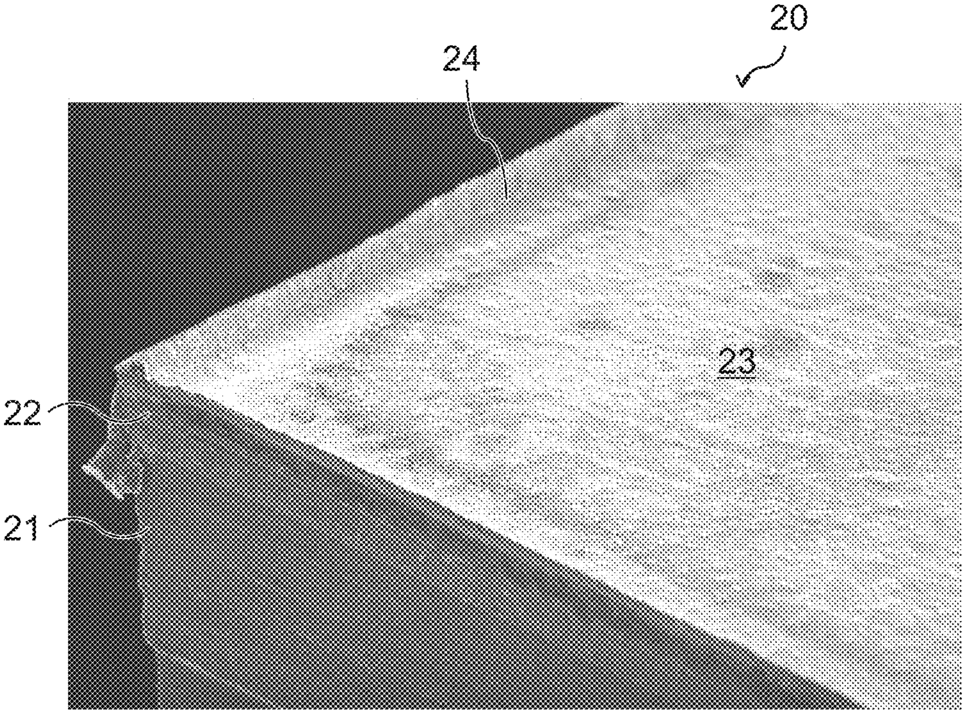
FIG. 4 is an SEM image of the semiconductor chip according to the embodiment.

A semiconductor device 1 according to a first embodiment will be described with reference to FIGS. 1A to 4. FIG. 1A is a plan view of a semiconductor device 1 according to the present embodiment. FIG. 1B is a cross-sectional view of the semiconductor device 1 according to the present embodiment taken along line I-I in FIG. 1A. FIG. 2 is a cross-sectional view of a semiconductor chip 20 according to the embodiment. FIG. 3A is a scanning electron microscope image (SEM image) of the semiconductor chip 20 in a dicing portion after dicing a semiconductor wafer according to the embodiment. FIG. 3B is an SEM image of the semiconductor chip in the dicing portion after dicing a semiconductor wafer according to a comparative example. FIG. 4 is an SEM image of the semiconductor chip 20 according to the embodiment. Since FIGS. 3A and 3B each represent a dicing portion after dicing the semiconductor wafer, FIGS. 3A and 3B each illustrate end portions of two semiconductor chips around the dicing portion.

As illustrated in FIGS. 1A to 2, the semiconductor device 1 according to the present embodiment includes a lead frame 10, a semiconductor chip 20, and a bonding material 30.

The lead frame 10 includes a frame main surface 11 and a frame convex portion 12 provided on the frame main surface 11. The frame convex portion 12 is a region (mounting region) on the frame main surface 11 where the semiconductor chip 20 is mounted. As illustrated in FIG. 1A, a size of the frame convex portion 12 is slightly smaller than that of the semiconductor chip 20 in plan view. The lead frame 10 may include a lead (not illustrated) or the like.

As illustrated in FIGS. 1B to 3, the semiconductor chip 20 includes a semiconductor layer 21 and an electrode 22 provided on a bottom surface of the semiconductor layer 21. In the semiconductor device 1, the electrode 22 of the semiconductor chip 20 is bonded to the frame convex portion 12 of the lead frame 10 via the bonding material 30. As illustrated in FIG. 1A, in the present embodiment, since the semiconductor chip 20 has a square shape in plan view, the frame convex portion 12 has a square shape. The present invention is not limited thereto, and the semiconductor chip 20 may have a rectangular shape in plan view. In this case, the frame convex portion 12 has a rectangular shape in plan view.

In the present embodiment, the semiconductor chip 20 is an IGBT. Note that a type of the semiconductor chip 20 is not particularly limited, and for example, the semiconductor chip 20 may be a MOSFET, an FRD, or the like.

The semiconductor layer 21 includes a p-type semiconductor region and an n-type semiconductor region formed according to the type of the semiconductor chip 20. The semiconductor layer 21 is a semiconductor layer made of a semiconductor containing any of silicon (Si), silicon carbide (SiC), and gallium nitride (GaN), for example. In a case where silicon is used as the material of the semiconductor layer 21, for example, arsenic, phosphorus, or antimony is used as an n-type impurity, and for example, boron is used as a p-type impurity. Note that the semiconductor layer 21 may be an epitaxial layer, may be a semiconductor substrate obtained by dividing a wafer, or may include an epitaxial layer and a semiconductor substrate.

In the present embodiment, the electrode 22 is a collector electrode of the IGBT. In this case, a surface of the semiconductor layer 21 in contact with the electrode 22 is a p-type semiconductor region.

The bonding material 30 bonds the semiconductor chip 20 to the lead frame 10. More specifically, the electrode 22 of the semiconductor chip 20 is bonded to the frame convex portion 12 of the lead frame 10. As the bonding material 30, various materials such as solder and conductive paste can be applied. In FIGS. 1B and 2, the bonding material 30 is laterally wider than semiconductor chip 20, but the present invention is not limited thereto, and the bonding material 30 may have the same width as semiconductor chip 20.

Next, details of the electrode 22 will be described. As illustrated in FIGS. 1B to 3A and 4, the electrode 22 has an electrode main surface 23 on a side opposite to a surface in contact with the semiconductor layer 21, and a protrusion 24 provided on the electrode main surface 23. As illustrated in FIG. 4, the protrusion 24 is provided so as to surround the electrode main surface 23. In the semiconductor device 1 in which the electrode 22 is bonded to the frame convex portion 12, as illustrated in FIGS. 1B and 2, the protrusion 24 surrounds the frame convex portion 12. In addition, in the semiconductor device 1 according to the present embodiment, the electrode main surface 23 faces a top surface 12*b* of the frame convex portion 12, and the protrusion 24 surrounds the frame convex portion 12 when viewed in a direction perpendicular to a direction in which the top surface 12*b* faces.

In the present embodiment, as illustrated in FIG. 2, a concave portion C defined by the electrode main surface 23 and the protrusion 24 of the electrode 22 is fitted to the frame convex portion 12 of the lead frame 10. More specifically, a tip of the mounted protrusion 24 is positioned at a height lower than an upper surface of the frame convex portion 12, and the frame convex portion 12 is positioned between the left and right protrusions 24. As described above, since the concave portion C and the frame convex portion 12 are fitted to each other, it is possible to suppress deviation when the semiconductor chip 20 is mounted on the frame convex portion 12. The term "fitting" used in the present application is not limited to the case where the frame convex portion 12 and the concave portion C of the electrode 22 are strictly fitted, but also includes the case where the semiconductor chip 20 is loosely fitted to the extent of being positioned on the frame convex portion 12.

As illustrated in FIGS. 2 and 3A, in the present embodiment, an outer side surface 24*a* of the protrusion 24 is flush with a side surface 21*a* of the semiconductor layer 21. In other words, the outer side surface 24*a* and the side surface 21*a* are positioned on the same plane. More specifically, a side surface 22*a* of the electrode 22 includes the outer side surface 24*a* of the protrusion 24, and the side surface 22*a* is flush with the side surface 21*a* of the semiconductor layer 21. On the other hand, an inner surface 24*b* of the protrusion 24 intersects with the outer side surface 24*a* at an acute angle, and is shaped to be more inward (center side of the electrode main surface 23) as it goes away from the tip. More specifically, a length of the protrusion 24 in a lateral direction increases from the tip of the protrusion 24 toward the electrode main surface 23. As described later, since the protrusion 24 is a burr formed at the time of dicing, the protrusion has such a shape.

The internal configuration of the electrode 22 will be described. As illustrated in FIGS. 2 and 3A, the electrode 22 includes a metal layer 25 and a metal layer 26 laminated on the metal layer 25 in order from the frame convex portion 12 side, that is, in order from the electrode main surface 23 side in the semiconductor chip 20.

The metal layer 25 forms a bottom surface of the semiconductor chip 20 and is made of a metal harder (that is, the Young's modulus is large) than the metal layer 26. The material of the metal layer 25 includes, for example, nickel, copper, or both of them. In the present embodiment, the material of the metal layer 25 is mainly nickel. A surface treatment layer made of gold (Au) or the like may be further provided on the metal layer 25.

The metal layer 26 is made of a material different from that of the metal layer 25, and is made of a metal softer (that is, the Young's modulus is small) than the metal layer 25. The material of the metal layer 26 includes, for example, aluminum, silver, or both of them. In the present embodiment, the material of the metal layer 26 is mainly aluminum.

As illustrated in FIG. 2, a thickness T1 of the metal layer 25 is smaller than a thickness T2 of the metal layer 26. In particular, the metal layer 26 is thicker than the metal layer 25 on the outer side surface 24*a* of the protrusion 24 and the side surface 22*a* of the electrode 22 (that is, when the semiconductor chip 20 is viewed from the side).

As will be described in detail later, by providing the hard and thin metal layer 25 on the soft and thick metal layer 26 in this manner, it is possible to form a strong burr-shaped protrusion 24 at the time of dicing.

Here, a semiconductor chip according to a comparative example will be described with reference to FIG. 3B. In the semiconductor chip 200 according to the comparative example, a strong protrusion is not formed. As illustrated in FIG. 3B, in semiconductor chip 200, an electrode 220 is provided on semiconductor layer 210. The electrode 220 has a hard metal layer 250 and a soft metal layer 260, but a thickness of the metal layer 260 is equal to or less than a thickness of the metal layer 250. Therefore, as illustrated in FIG. 3B, in the semiconductor chip 200 according to the comparative example, a protrusion 240 is not strong. Therefore, it is difficult to suppress deviation of the semiconductor chip by fitting the semiconductor chip 200 and the frame convex portion 12 by using the protrusion 240 in the mounting process.

Manufacturing Method of First Embodiment

Figure 5:
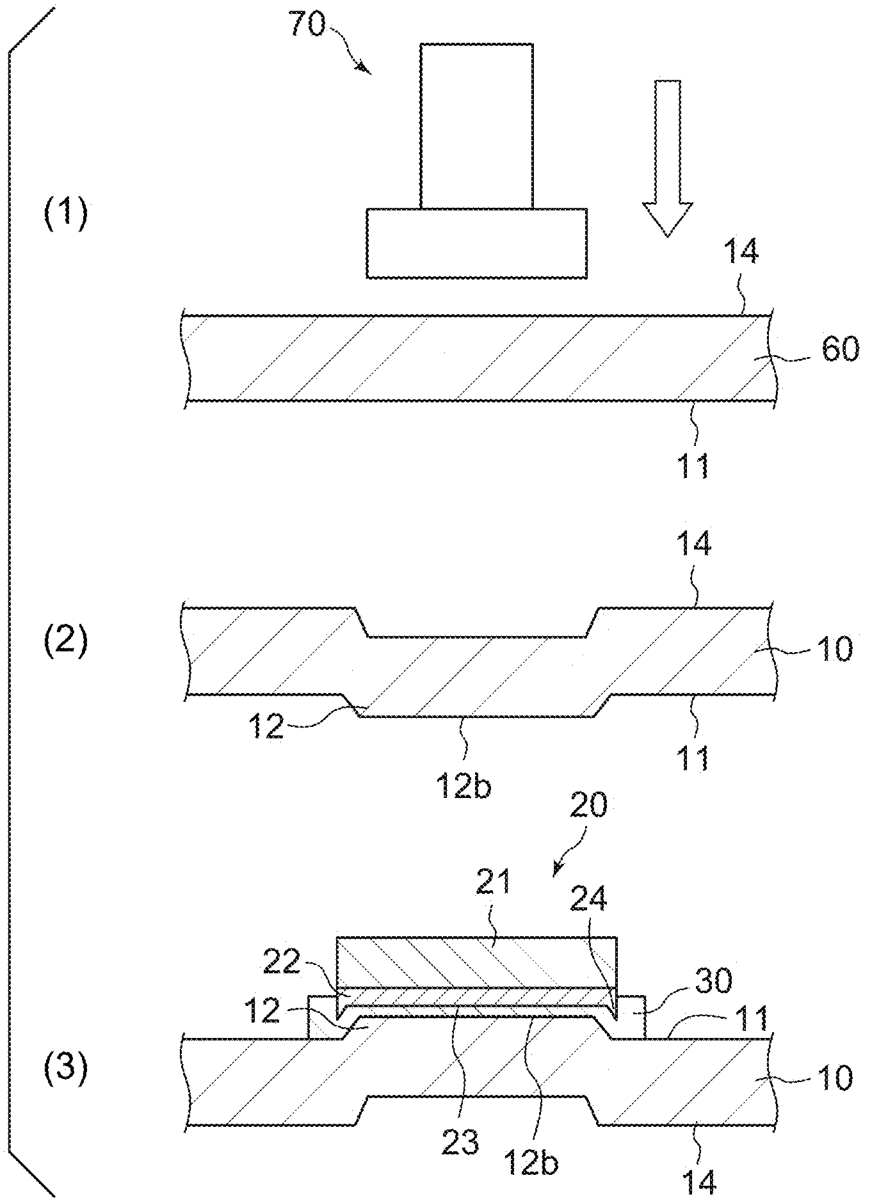
FIG. 5 is a diagram for describing a method for manufacturing the semiconductor device according to the first embodiment.
Figure 6:
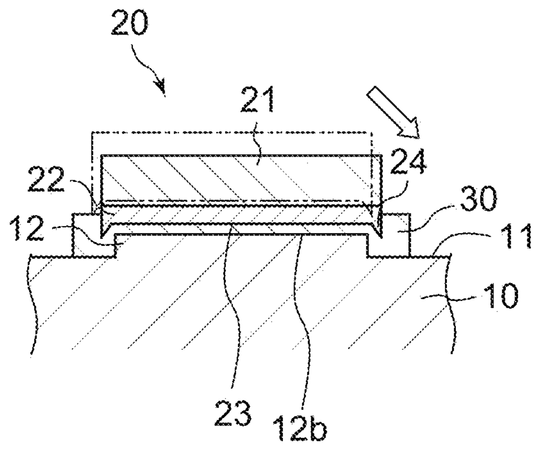
FIG. 6 is a diagram for describing self-alignment in a mounting process.

Next, a method for manufacturing the semiconductor device 1 according to the first embodiment will be described with reference to FIGS. 5 and 6. FIG. 5 is a diagram for describing the method for manufacturing the semiconductor device 1 according to the present embodiment. FIG. 6 is a diagram for describing self-alignment in the mounting process.

First, as illustrated in (1) of FIG. 5, a flat lead frame member 60 is prepared. The lead frame member 60 is a plate-like material for manufacturing the lead frame 10, and has a frame main surface 11 and a back surface 14 opposite to the frame main surface 11.

Next, as illustrated in (1) of FIG. 5, the lead frame member 60 is pressed from the back surface 14 of the lead frame member 60 by using a pressing machine 70. As a result, as illustrated in (2) of FIG. 5, the frame convex portion 12 is formed on the frame main surface 11.

Next, as illustrated in (3) of FIG. 5, the semiconductor chip 20 is mounted on the lead frame 10. More specifically, first, the bonding material 30 is applied to the frame convex portion 12, and then the semiconductor chip 20 is mounted by using a chip mounter. At this time, as illustrated in FIG. 6, even when a mount position of the semiconductor chip 20 is deviated, a self-alignment effect is generated in which the semiconductor chip 20 automatically moves so that the frame convex portion 12 and the concave portion C are fitted. That is, the protrusion 24 of the electrode 22 moves so as to surround the frame convex portion 12. More specifically, in the example illustrated in FIG. 6, the semiconductor chip 20 moves from a position of a two-dot chain line in a direction of an arrow (diagonally downward to the right) and moves to a position of the semiconductor chip 20 indicated by a solid line. As a result, the semiconductor chip 20 is bonded to a predetermined position (frame convex portion 12) of the lead frame 10.

Through the above process, the semiconductor device 1 can be manufactured. As described above, according to the method for manufacturing the semiconductor device 1 according to the first embodiment, the semiconductor device 1 including the lead frame 10 having the frame convex portion 12 and the semiconductor chip 20 having the protrusion 24 surrounding the frame convex portion 12 can be easily manufactured. That is, it is possible to manufacture the semiconductor device 1 easily and at low cost by avoiding an increase in process difficulty due to the addition of a position adjustment process and an increase in cost due to the necessity of a separate jig.

Note that the semiconductor chip 20 is manufactured as follows, for example.

First, a semiconductor wafer (not illustrated) including the semiconductor layer 21 and an electrode layer provided at a bottom of the semiconductor layer 21 is prepared. The electrode layer includes, in order from an electrode main surface side (outer side), a hard metal layer that becomes the metal layer 25 of the electrode 22 after dicing, and a soft metal layer that becomes the metal layer 26 of the electrode 22 after dicing.

Next, the semiconductor wafer is diced by applying a dicing blade from the side opposite to the electrode layer, thereby forming the semiconductor chip 20. During dicing, in the electrode layer, the soft metal layer largely stretches, while the hard metal layer hardly stretches. Therefore, the hard metal layer is deformed downward while maintaining the thickness, and the soft metal layer is deformed so as to fill a gap generated by the deformation. As a result, as illustrated in FIG. 3A, the protrusion 24 having the hard metal layer 25 and the soft metal layer 26 is formed. As illustrated in FIG. 3A, the outer side surface 24*a* of the protrusion 24 is flush with the side surface 21*a* of the semiconductor layer 21. More specifically, the side surface 22*a* of the electrode 22 including the outer side surface 24*a* of the protrusion 24 is flush with the side surface 21*a* of the semiconductor layer 21. Further, since dicing is performed in four directions of the semiconductor chip 20, the protrusion 24 is formed so as to surround the electrode main surface 23.

In the above description, the frame convex portion 12 is formed by pressing the lead frame member 60 from the back surface 14 of the lead frame member 60. Without being limited to this, the frame convex portion 12 may be formed by pressing the lead frame member 60 from the frame main surface 11 of the lead frame member 60. In addition, the frame convex portion 12 may be formed by fixing a member that becomes the frame convex portion 12 to the lead frame member 60 without being limited to the press working.

As described above, according to the semiconductor device 1 according to the first embodiment, the frame convex portion 12 is provided on the lead frame 10, the electrode 22 of the semiconductor chip 20 is bonded to the frame convex portion 12, and the electrode 22 has the protrusion 24 surrounding the frame convex portion 12. That is, the concave portion C defined by the electrode main surface 23 and the protrusion 24 is fitted to the frame convex portion 12. As a result, a self-alignment effect can be obtained when the semiconductor chip 20 is mounted, so that the semiconductor chip 20 is appropriately mounted on the frame convex portion 12.

Figure 10A:
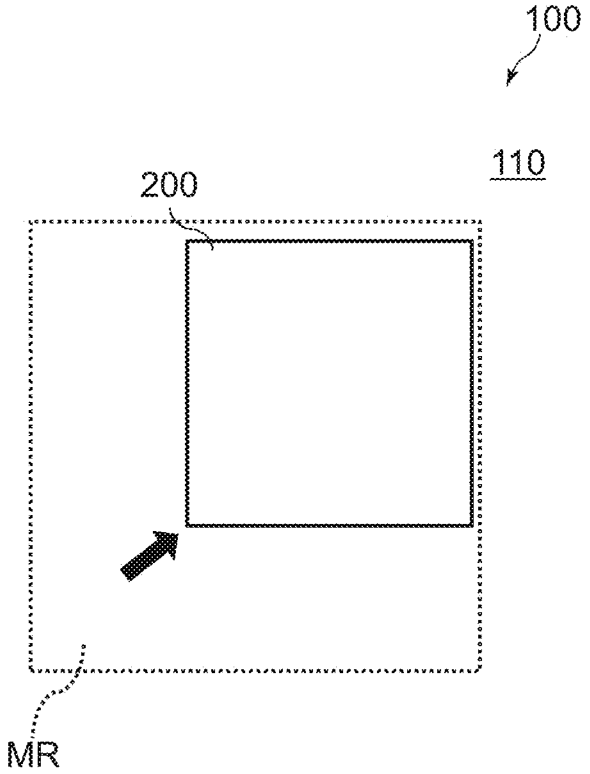
FIG. 10A is a diagram for describing positional deviation of a semiconductor device according to a comparative example.
Figure 10B:
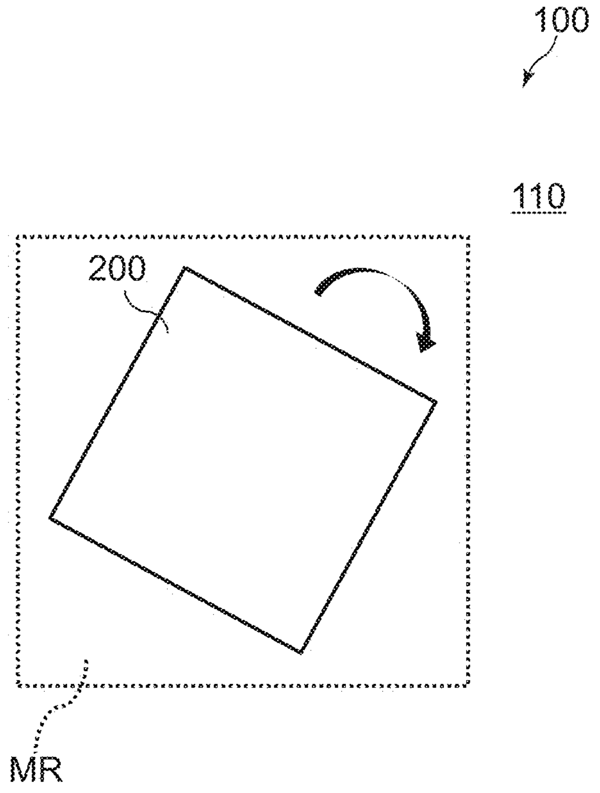
FIG. 10B is a diagram for describing angular deviation of the semiconductor device according to the comparative example.

Here, an area occupancy of the semiconductor chip with respect to the lead frame will be described with reference to FIGS. 10A and 10B. FIG. 10A is a diagram for describing positional deviation of a semiconductor device according to a comparative example. FIG. 10B is a diagram for describing angular deviation of the semiconductor device according to the comparative example.

As illustrated in FIG. 10A, when the semiconductor chip 200 having no strong protrusion is bonded to the frame main surface 110 of the lead frame 100, the semiconductor chip 200 may move in a direction parallel to the frame main surface 110. As illustrated in FIG. 10B, when the semiconductor chip 200 is bonded to the frame main surface 110 of the lead frame 100, the semiconductor chip 200 may rotate in a plane parallel to the frame main surface 110.

As described above, when the semiconductor chip 200 having no strong protrusion is mounted on the lead frame 100 having no convex portion, a mounting region MR needs to be designed to be larger than the semiconductor chip 200 in plan view. Therefore, it is difficult to downsize the semiconductor device.

On the other hand, in the semiconductor device 1 according to the present embodiment, since the deviation is suppressed by the self-alignment effect, the mounting region in the lead frame 10 may be about the same as the size of the semiconductor chip 20. Therefore, the area occupancy of the semiconductor chip 20 with respect to the lead frame 10 can be improved, and the semiconductor device 1 can be downsized.

In addition, since the deviation is suppressed by the self-alignment effect, the semiconductor device 1 can be manufactured easily and at low cost without requiring a position adjustment process or a separate or dedicated jig in the mounting process of the semiconductor chip 20.

In addition, since a dedicated jig is not required, the semiconductor chips 20 having different sizes can be easily manufactured.

Note that, for example, when the semiconductor device 1 is a vertical Nch MOSFET, or when the semiconductor device 1 is an FRD and the electrode 22 is a cathode electrode of the FRD, a surface of the semiconductor layer 21 in contact with the electrode 22 is an n-type semiconductor region. In this case, a third metal layer that forms an ohmic junction between the n-type semiconductor region and the electrode 22 may be provided between the metal layer 26 and the semiconductor layer 21. The material of the third metal layer is, for example, titanium. Although titanium has a Young's modulus larger than that of aluminum, which is an example of the metal layer 26, when the thickness is sufficiently smaller than that of the metal layer 26, it is possible to form the strong protrusion 24 at the time of dicing. As described above, by providing the third metal layer, even when the electrode 22 is in contact with the n-type semiconductor region, the protrusion 24 can be formed without impairing the electrical characteristic.

In addition, the surface of the semiconductor layer 21 in contact with the electrode 22 may be flat. That is, the semiconductor layer 21 itself may not have the protrusion surrounding the frame convex portion 12. This makes it possible to suppress the influence on the characteristic of the semiconductor. Furthermore, the thicknesses of the metal layers 25 and 26 can be made uniform, and the uniform protrusion 24 surrounding the electrode main surface 23 can be formed. Therefore, when the semiconductor chip 20 is mounted, the semiconductor chip 20 can be prevented from rotating about an axis parallel to the frame main surface 11. Note that, in order to improve adhesion between the semiconductor layer 21 and the electrode 22, a case where the surface of the semiconductor layer 21 in contact with the electrode 22 is roughened within a range where the influence on the characteristic of the semiconductor is small is also included in the case where the surface of the semiconductor layer 21 in contact with the electrode 22 is flat.

As illustrated in FIG. 2, a height L1 of the frame convex portion 12 may be higher than a height L2 of the protrusion 24. As a result, when the semiconductor chip 20 is bonded, the tip of the protrusion 24 of the semiconductor chip 20 and the frame main surface 11 of the lead frame 10 are separated from each other, so that it is possible to suppress a decrease in bonding strength due to the tip of the protrusion 24 abutting on the frame main surface 11.

As illustrated in FIG. 2, a thickness L3 of the bonding material 30 filled in the concave portion C may be smaller than the height L2 of the protrusion 24. As a result, the self-alignment effect by the protrusion 24 can be improved.

First Modification of First Embodiment

Figure 7A:
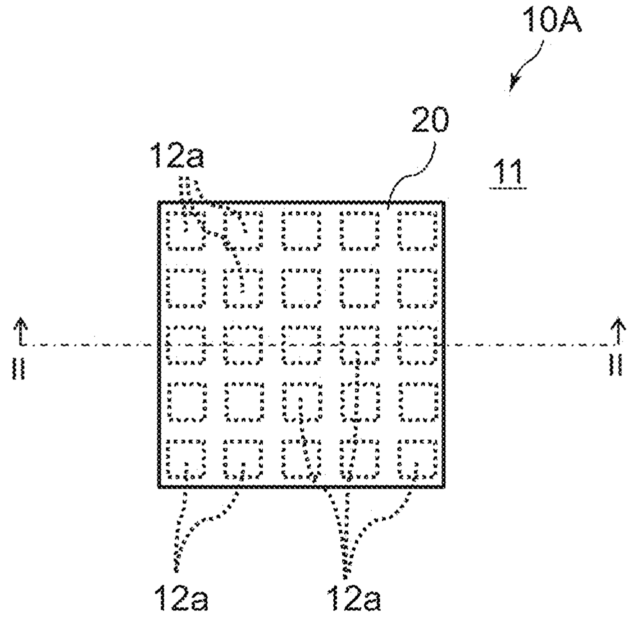
FIG. 7A is a plan view of a semiconductor device according to a first modification of the first embodiment.
Figure 7B:
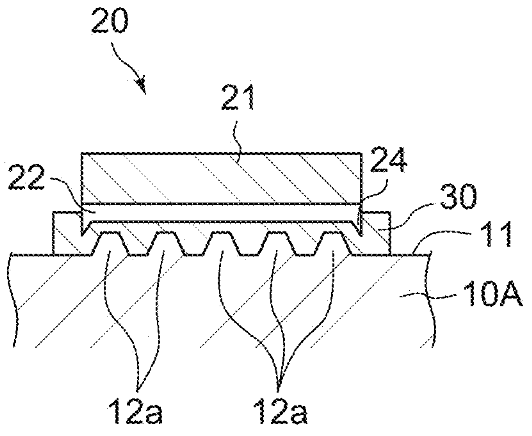
FIG. 7B is a cross-sectional view of the semiconductor device according to the first modification of the first embodiment taken along line II-II in FIG. 7A.

A first modification of the first embodiment will be described with reference to FIGS. 7A and 7B. FIG. 7A is a plan view of a semiconductor device according to the present modification. FIG. 7B is a cross-sectional view of the semiconductor device according to the present modification taken along line II-II in FIG. 7A.

One of differences between the present modification and the first embodiment is the shape of the frame convex portion. Hereinafter, the present modification will be described focusing on the differences from the first embodiment, and description of similar parts will be omitted.

As illustrated in FIGS. 7A and 7B, in the present modification, the frame convex portion of a lead frame 10A has a plurality of small convex portions 12*a* aligned in a lattice shape. The shape of the plurality of small convex portions 12*a* is, for example, a truncated quadrangular pyramid shape.

By providing the plurality of small convex portions 12*a* in this manner, the semiconductor chips 20 having different sizes can be bonded to the lead frame 10A. The semiconductor chip 20 having a small size may be bonded to the lead frame 10A such that the protrusion 24 is positioned in a gap between the small convex portions 12*a*. Therefore, according to the present modification, one type of lead frame 10A can be used for a plurality of types of semiconductor chips 20.

In addition, the bonding material 30 easily penetrates into the gap between the small convex portions 12*a* at the time of bonding, and the bonding material 30 has a larger surface area than that of the first embodiment after bonding, so that the bonding strength between the lead frame 10A and the semiconductor chip 20 can be improved.

The plurality of small convex portions 12*a* may be formed by pressing from the frame main surface 11 side of the lead frame 10A by using a pressing machine having a die corresponding to the plurality of small convex portions 12*a*.

In addition, the number of small convex portions 12*a* and the size and arrangement form of each small convex portion 12*a* are not limited to those illustrated in FIGS. 7A and 7B, and are arbitrary. For example, in FIG. 7A, the same number of small convex portions 12*a* are arranged in each of the longitudinal direction and the lateral direction, and the frame convex portion has a square shape as a whole, but the present invention is not limited thereto. Different numbers of small convex portions 12*a* may be arranged in each of the longitudinal direction and the lateral direction, and the frame convex portion may have a rectangular shape as a whole. The planar shape of each small convex portion 12*a* is not limited to a quadrangle, and may be another polygon such as a triangle or a circle.

Second Modification of First Embodiment

Figure 8A:
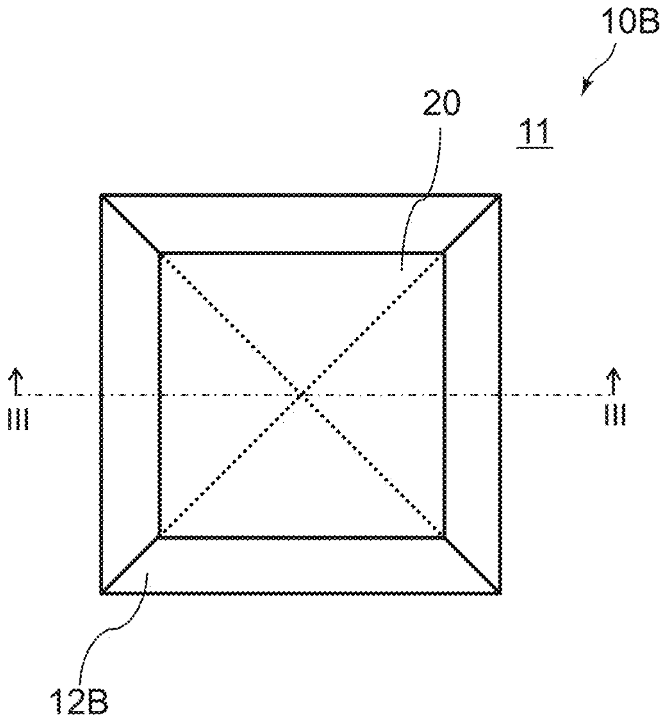
FIG. 8A is a plan view of a semiconductor device according to a second modification of the first embodiment.
Figure 8B:
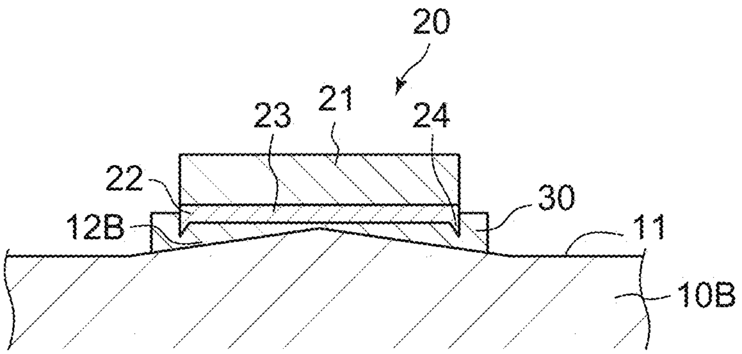
FIG. 8B is a cross-sectional view of the semiconductor device according to the second modification of the first embodiment taken along line III-III in FIG. 8A.

A second modification of the first embodiment will be described with reference to FIGS. 8A and 8B. FIG. 8A is a plan view of a semiconductor device according to the present modification. FIG. 8B is a cross-sectional view of the semiconductor device according to the present modification taken along line III-III in FIG. 8A.

One of differences between the present modification and the first embodiment is the shape of the frame convex portion. Hereinafter, the present modification will be described focusing on the differences from the first embodiment, and description of similar parts will be omitted.

As illustrated in FIGS. 8A and 8B, in the present modification, a frame convex portion 12B of a lead frame 10B has a quadrangular pyramid shape. The semiconductor chip 20 is bonded to the lead frame 10B in a state where a side of the electrode 22 is positioned so as to be parallel to a side of the frame convex portion 12B. Thus, the lead frame 10B can cope with any size as long as the semiconductor chip 20 has a side shorter than that of the frame convex portion 12B. Therefore, according to the present modification, it is possible to more flexibly cope with the semiconductor chips 20 of different sizes.

The frame convex portion 12B may be formed by pressing from the frame main surface 11 side of the lead frame 10B by using a pressing machine having a die corresponding to the frame convex portion 12B.

The frame convex portion 12B may have a truncated quadrangular pyramid shape with a flat upper surface.

Second Embodiment

Figure 9:
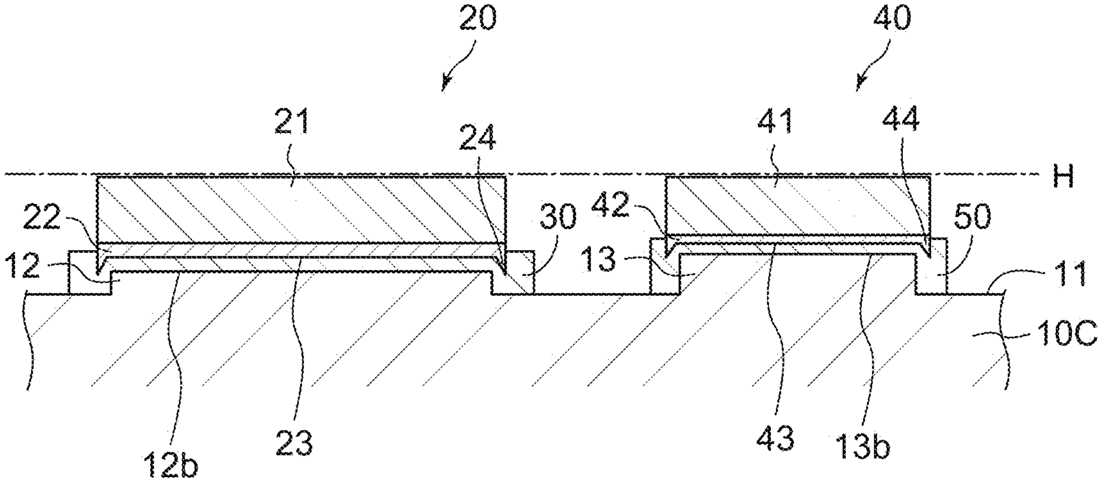
FIG. 9 is a cross-sectional view of a semiconductor device according to a second embodiment.

A semiconductor device according to a second embodiment will be described with reference to FIG. 9. FIG. 9 is a cross-sectional view of the semiconductor device according to the present embodiment. Hereinafter, the present embodiment will be described focusing on differences from the first embodiment, and description of similar parts will be omitted.

As illustrated in FIG. 9, the semiconductor device according to the present embodiment further includes a semiconductor chip 40 and a bonding material 50 that bonds the semiconductor chip 40 to a lead frame 10C, in addition to the semiconductor device 1 according to the first embodiment. The frame main surface 11 of the lead frame 10C is provided with a frame convex portion 13 for the semiconductor chip 40.

The semiconductor chip 40 has the same configuration as that of the semiconductor chip 20 except that the semiconductor chip 40 has a thickness different from that of the semiconductor chip 20. That is, the semiconductor chip 40 includes a semiconductor layer 41 and an electrode 42 provided on a bottom surface of the semiconductor layer 41. The electrode 42 has an electrode main surface 43 on a side opposite to a surface in contact with the semiconductor layer 41, and a protrusion 44 provided so as to surround the electrode main surface 43. An outer side surface of the protrusion 44 is flush with a side surface of the semiconductor layer 41. In the semiconductor device in which the electrode 42 of the semiconductor chip 40 is bonded to the frame convex portion 13 of the lead frame 10C, the protrusion 44 surrounds the frame convex portion 13. That is, the electrode main surface 43 faces a top surface 13*b* of the frame convex portion 13, and the protrusion 44 surrounds the frame convex portion 13 when viewed in a direction perpendicular to the direction in which the top surface 13*b* faces. The semiconductor chip 40 is positioned by the frame convex portion 13 and a concave portion defined by the electrode main surface 43 and the protrusion 44.

The frame convex portion 13 is different in a height from the frame convex portion 12. More specifically, the heights of the frame convex portions 12 and 13 are heights in which the height of the upper surface of the semiconductor chip 20 and the height of the upper surface of the semiconductor chip 40 become the same height H after the semiconductor chips 20 and 40 are bonded. Therefore, as illustrated in FIG. 9, when the semiconductor chip 40 is thinner than the semiconductor chip 20, the frame convex portion 13 for the semiconductor chip 40 is higher than the frame convex portion 12 for the semiconductor chip 20.

As described above, according to the semiconductor device according to the second embodiment, it is possible to provide the semiconductor device in which the heights of the upper surfaces of the semiconductor chips 20 and 40 are uniform by a simple configuration in which the frame convex portions 12 and 13 having different heights are provided when the plurality of semiconductor chips 20 and 40 having different thicknesses are mounted on one lead frame 10C. Therefore, for example, wire bonding for electrically coupling the semiconductor chip 20 and the semiconductor chip 40 with wire can be stabilized.

Note that the semiconductor chip 40 may have the same thickness as the semiconductor chip 20. In this case, the frame convex portion 13 may have the same height as the frame convex portion 12.

While certain embodiments n described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:

a lead frame including a frame main surface and a frame convex portion provided on the frame main surface; and a semiconductor chip including a semiconductor layer and an electrode provided on a bottom surface of the semiconductor layer and bonded to the frame convex portion, wherein the electrode of the semiconductor chip has a burr surrounding the frame convex portion, and an outer side surface of the burr is flush with a side surface of the semiconductor layer.

2. The semiconductor device according to claim 1, wherein the electrode of the semiconductor chip includes, in order from the frame convex portion side, a first metal layer and a second metal layer laminated on the first metal layer and made of a material different from that of the first metal layer.

3. The semiconductor device according to claim 2, wherein a Young's modulus of the first metal layer is larger than a Young's modulus of the second metal layer.

4. The semiconductor device according to claim 3, wherein a material of the first metal layer includes nickel and/or copper, and a material of the second metal layer includes aluminum and/or silver.

5. The semiconductor device according to claim 2, wherein a thickness of the first metal layer is smaller than a thickness of the second metal layer.

6. The semiconductor device according to claim 1, wherein the frame convex portion of the lead frame includes a plurality of small convex portions.

7. The semiconductor device according to claim 1, wherein the frame convex portion of the lead frame has a quadrangular pyramid shape.

8. The semiconductor device according to claim 1, wherein a second frame convex portion having a height different from that of the frame convex portion is provided on the frame main surface of the lead frame, the semiconductor device further comprises a second semiconductor chip having a second semiconductor layer and a second electrode provided on a bottom surface of the second semiconductor layer and bonded to the second frame convex portion, the second semiconductor chip having a thickness different from that of the semiconductor chip, the second electrode of the second semiconductor chip has a second burr surrounding the second frame convex portion, an outer side surface of the second burr is flush with a side surface of the second semiconductor layer, and a height of an upper surface of the semiconductor chip is the same as a height of an upper surface of the second semiconductor chip.

9. The semiconductor device according to claim 1, wherein a concave portion defined by an electrode main surface of the electrode on a side opposite to a surface in contact with the semiconductor layer and the burr is fitted to the frame convex portion of the lead frame.

10. The semiconductor device according to claim 1, wherein a surface of the semiconductor layer in contact with the electrode is flat.

11. The semiconductor device according to claim 1, wherein a height of the frame convex portion is higher than a height of the burr such that the protrusion of the semiconductor chip is separated from the frame main surface of the lead frame.

12. The semiconductor device according to claim 1, wherein the semiconductor chip is an IGBT, a MOSFET, or an FRD.

13. A semiconductor device comprising:

a lead frame including a frame main surface and a frame convex portion provided on the frame main surface; and a semiconductor chip including a semiconductor layer and an electrode provided on a bottom surface of the semiconductor layer and bonded to the frame convex portion, wherein the electrode of the semiconductor chip has a protrusion surrounding the frame convex portion in a first direction and a second direction, the first direction is along the semiconductor layer and crosses a stacking direction, the second direction crosses the first direction and the stacking direction, an inner surface of the protrusion and an outer surface of the protrusion coincide with each other at an end of the protrusion, and an angle of the protrusion between the inner surface of the protrusion and the outer surface of the protrusion is an acute angle.

14. The semiconductor device according to claim 13, wherein the frame convex portion of the lead frame includes a plurality of small convex sub-portions.

15. The semiconductor device according to claim 13, wherein the frame convex portion of the lead frame has a quadrangular pyramid shape.

16. The semiconductor device according to claim 13, wherein a height of the frame convex portion is higher than a height of the protrusion, and the protrusion is separated from the frame main surface of the lead frame.

17. A semiconductor device comprising:

a lead frame including a frame main surface and a frame convex portion provided on the frame main surface; and a semiconductor chip including a semiconductor layer and an electrode provided on a bottom surface of the semiconductor layer and bonded to the frame convex portion, wherein the electrode of the semiconductor chip has a protrusion surrounding the frame convex portion, the bottom surface of the semiconductor layer includes a first region overlapping the protrusion in a stacking direction, and a second region overlapping the frame convex portion in the stacking direction, and the first region and the second region are in a same plane.

18. The semiconductor device according to claim 17, wherein the frame convex portion of the lead frame includes a plurality of small convex sub-portions.

19. The semiconductor device according to claim 17, wherein the frame convex portion of the lead frame has a quadrangular pyramid shape.

20. The semiconductor device according to claim 17, wherein a height of the frame convex portion is higher than a height of the protrusion, and the protrusion is separated from the frame main surface of the lead frame.

* * * * *